(12) United States Patent
Jang

(10) Patent No.: US 8,465,176 B2
(45) Date of Patent: Jun. 18, 2013

(54) LIGHT EMITTING DEVICE AND LIGHT UNIT USING THE SAME

(75) Inventor: Kee Youn Jang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 314 days.

(21) Appl. No.: 12/882,839

(22) Filed: Sep. 15, 2010

(65) Prior Publication Data

US 2011/0149600 A1 Jun. 23, 2011

(30) Foreign Application Priority Data

Dec. 21, 2009 (KR) ........................ 10-2009-0128530

(51) Int. Cl.
*F21V 21/00* (2006.01)
*F21V 7/20* (2006.01)

(52) U.S. Cl.
USPC ................. 362/249.06; 362/249.02; 362/345

(58) Field of Classification Search
USPC ............ 362/235, 249.02, 612, 613, 632–634, 362/345, 249.06; 257/98–100
See application file for complete search history.

(56) References Cited

U.S. PATENT DOCUMENTS

2006/0214179 A1* 9/2006 Cao .................................. 257/99
2007/0246714 A1 10/2007 Koike et al.

FOREIGN PATENT DOCUMENTS

| JP | 2008-108942 | 5/2008 |
| KR | 10-0782797 | 12/2007 |
| KR | 10-2009-99785 | 9/2009 |

* cited by examiner

*Primary Examiner* — Thomas Sember
(74) *Attorney, Agent, or Firm* — McKenna Long & Aldridge LLP

(57) ABSTRACT

Provided is a light emitting device and light unit using the same. The light emitting device comprises: a body including a horizontal surface; an insulating layer over at least a portion of the horizontal surface; an electrode over at least a portion of the insulating layer; a heat radiation member formed within the body and protruding from the horizontal surface, the heat radiation member comprising two or more surfaces that are inclined with respect to the horizontal surface; and two or more light emitting diodes, wherein each of the two or more light emitting diodes is mounted on a respective one of the two or more inclined surfaces, and wherein each of the two or more light emitting diodes is electrically connected to the electrode.

17 Claims, 10 Drawing Sheets

LIGHT EMITTING DEVICE AND LIGHT UNIT USING THE SAME

CROSS-REFERENCE TO RELATED APPLICATIONS

The present application claims priority under 35 U.S.C. §119 to Korean Patent Application No. 10-2009-0128530 filed on Dec. 21, 2009, which is hereby incorporated by reference in its entirety.

BACKGROUND

A light emitting diode (LED) a semiconductor light emitting device converting current to light. In recent years, an LED can be implemented as a light emitting device emitting white light having superior efficiency by using fluorescent material or by combining individual LEDs that emit three primary colors.

Also, since the luminance of the light emitting device using an LED increases gradually, the light emitting device is being used as a light source in various fields, such as a backlight for displays, a lighting display, an image display, etc.

SUMMARY

Embodiments provide a light emitting device that allow an orientation angle to be adjusted inside a package, has superior light efficiency, and can guarantee heat radiation performance.

Embodiments also provide a light unit that has superior light efficiency and can decrease the number of light emitting devices.

In one embodiment, a light emitting device comprises: a body including a horizontal surface; an insulating layer over at least a portion of the horizontal surface; an electrode over at least a portion of the insulating layer; a heat radiation member formed within the body and protruding from the horizontal surface, the heat radiation member comprising two or more surfaces that are inclined with respect to the horizontal surface; and two or more light emitting diodes, wherein each of the two or more light emitting diodes is mounted on a respective one of the two or more inclined surfaces, and wherein each of the two or more light emitting diodes is electrically connected to the electrode.

In another embodiment, a light emitting device comprises: a body including a horizontal surface; an electrode disposed in the body; a heat radiation formed within the body and protruding from the horizontal surface, the heat radiation member comprising a mounting part that includes two surfaces that are inclined with respect to the horizontal surface; and two or more light emitting diodes, wherein each of the two or more light emitting diodes is mounted on a respective one of the two or more inclined surfaces, and wherein each of the two or more light emitting diodes is electrically connected to the electrode.

In a further embodiment, a light unit comprises: a light guide panel; and one or more light emitting devices, wherein each of the one or more light emitting devices has a respective orientation angle such that each of the one or more light emitting devices transmits light into the light guide panel at a corresponding, predetermined direction, and wherein each of the one or more light emitting devices comprises: a body including a horizontal surface; an insulating layer over at least a portion of the horizontal surface; an electrode over at least a portion of the insulating layer; a heat radiation member formed within the body and protruding from the horizontal surface, the heat radiation member comprising two or more surfaces that are inclined with respect to the horizontal surface; and two or more light emitting diodes, wherein each of the two or more light emitting diodes is mounted on a respective one of the two or more inclined surfaces, and wherein each of the two or more light emitting diodes is electrically connected to the electrode.

In still another embodiment, a light unit comprises: a light guide panel; and one or more light emitting devices, wherein each of the one or more light emitting devices has a respective orientation angle such that each of the one or more light emitting devices transmits light into the light guide panel at a corresponding, predetermined direction, and wherein each of the one or more light emitting devices comprises: a body including a horizontal surface; an electrode disposed in the body; a heat radiation formed within the body and protruding from the horizontal surface, the heat radiation member comprising a mounting part that includes two surfaces that are inclined with respect to the horizontal surface; and two or more light emitting diodes, wherein each of the two or more light emitting diodes is mounted on a respective one of the two or more inclined surfaces, and wherein each of the two or more light emitting diodes is electrically connected to the electrode.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are shown in the accompanying drawings. In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, it will also be understood that when a layer is referred to as being "between" two layers, it can be the only layer between the two layers, or one or more intervening layers may also be present. In the figures, the dimensions of layers and regions are exaggerated for clarity of illustration. In addition, the dimension of each part does not reflect an actual size.

Figure 1:
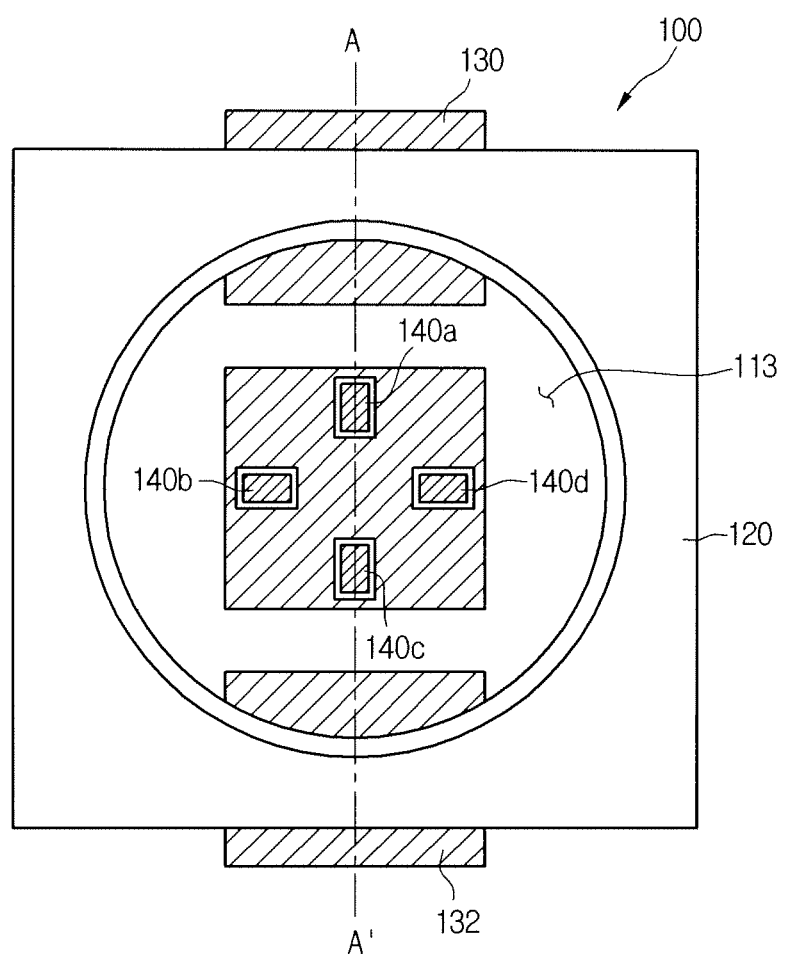
FIG. 1 is a plane view of a light emitting device according to a first embodiment.
Figure 2:
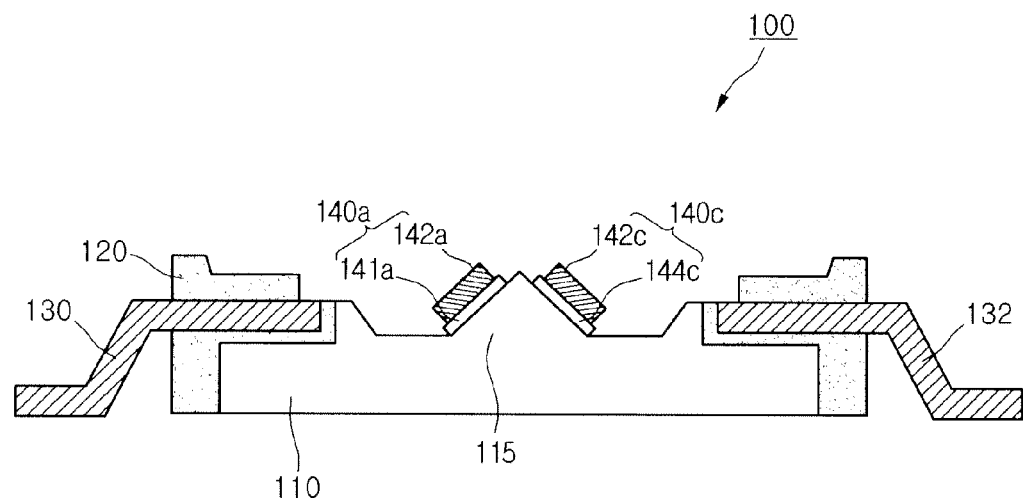
FIG. 2 is a cross-sectional view of a light emitting device according to the first embodiment.
Figure 3:
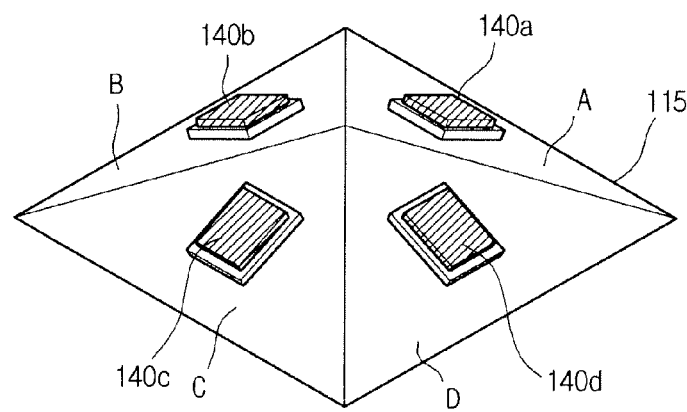
FIG. 3 is a detailed perspective view of a main part of a light emitting device according to the first embodiment.

FIG. 1 is a plane view of a light emitting device according to a first embodiment, FIG. 2 is a cross-sectional view of a light emitting device according to the first embodiment, and FIG. 3 is a detailed perspective view of a main part of a light emitting device according to the first embodiment and exemplarily shows that the current embodiment is applied to a lead frame package type light emitting device.

A light emitting device 100 according to the first embodiment includes a body 120 having a cavity 113, a first electrode 130 and a second electrode 132 disposed in the body 120, and a heat radiation member 110 having two or more inclination surfaces for mounting a plurality of light emitting diodes 140a, 140b, 140c, 140d in the cavity 113 and thermally connected to the light emitting diodes 140a, 140b, 140c, 140d. Herein, the cavity 113 in which the light emitting diodes 140a, 140b, 140c, 140d are mounted may be sealed by using a sealant (not shown).

The cavity 113 in which the light emitting diodes 140a, 140b, 140c, 140d are mounted may be formed at an upper portion of the body 120. The body 120 may be formed of various materials such as ceramic, silicon, resin, etc. The body 120 may be formed in a single body structure using an injection molding, or in a multi-layered structure.

The cavity 113 may be formed in a concave container shape, such as a cup shape, a polygonal shape, an elliptical shape, a circular shape, etc. Herein, a circumferential surface of the cavity 113 may be formed vertically or with a predetermined slope in consideration of distribution angles of the mounted light emitting diodes 140a, 140b, 140c, 140d. A surface of the cavity 113 may be coated or deposited with a high reflectivity material, for example, white photo solder resist (PSR) ink, silver (Ag), aluminum (Al) or the like, so that the luminous efficiency of the light emitting device 100 can be enhanced.

One terminals of the first and second electrodes 130 and 132 may be electrically connected to the light emitting diodes 140a, 140b, 140c, 140d, respectively, and the other terminals may be electrically connected to a substrate (not shown) on which the light emitting device 100 is mounted, to supply power to the light emitting diodes 140a, 140b, 140c, 140d. Therefore, the first and second electrodes 130 and 132 may be formed such that one terminals are disposed inside the body 120 on which the light emitting diodes 140a, 140b, 140c, 140d are mounted, and the other terminals are exposed to an outer lower side of the body 120. While FIG. 2 shows that the electrodes 130 and 132 are two, it is to be understood that two or more electrodes may be formed according to the number of the light emitting diodes 140a, 140b, 140c, 140d to be driven or controlled. Also, the first and second electrodes 130 and 132 are not limited to the shape shown in the drawings, but may be modified in various shapes, such as a shape enclosing the body 120 or in a shape the other terminals of which are branched. The light emitting diodes 140a, 140b, 140c, 140d may be provided in a structure in which light emitting chips 142a and 142c are formed on dies 144a and 144c, respectively. Each of the light emitting diodes 140a, 140b, 140c, 140d may be at least one of a red light emitting diode emitting red light, a green light emitting diode emitting green light, and a blue light emitting diode emitting blue light, and is not limited thereto. In this embodiment, since the light emitting diodes 140a, 140b, 140c, 140d are two or more, it is also possible to apply the light emitting diodes 140a, 140b, 140c, 140d each emitting a different color light.

The heat shielding member 110 is formed of material such as metal, resin or the like having a good thermal conductivity, and is thermally connected to the light emitting diodes 140a, 140b, 140c, 140d. At an upper portion of the heat shielding member 110, a heat radiation mounting part 115 having inclination surfaces on which the plurality of light emitting diodes 140a, 140b, 140c, 140d are mounted may be formed.

As shown in FIG. 3, the heat radiation mounting part 115 may be formed in a polyhedral structure having mounting surfaces on which the light emitting diodes are mounted. FIG. 3 exemplarily shows that the heat radiation mounting part 115 is formed in a quadrangular pyramid shape providing four inclination surfaces A, B, C, D for mounting the four light emitting diodes 140a, 140b, 140c, 140d.

When the light emitting diodes 140a, 140b, 140c, 140d are mounted on the inclination surfaces A, B, C, D of the quadrangular pyramid-shaped heat radiation mounting part 115, respectively, the light emitting diodes 140a, 140b, 140c, 140d are fixed with a slope on the inclination surfaces A, B, C, D. Accordingly, orientation angles of the respective light emitting diodes 140a, 140b, 140c, 140d are inclined according to the slopes of the inclination surfaces A, B, C, D, and thus the orientation angle in a specific direction may be increased. Accordingly, the orientation angle of the light emitting device 100 including the plurality of light emitting diodes 140a, 140b, 140c, 140d may be expanded or be concentrated in specific direction. The light emitting diodes 140a, 140b, 140c, 140d may have an orientation angle of 110°-130°, typically.

Also, since the heat radiation mounting part 115 has the polyhedral structure and thus can secure a wide heat radiation region, the heat radiation mounting part 115 can effectively radiate heat generated from the respective light emitting diodes 140a, 140b, 140c, 140d. The heat radiation mounting part 115 may be modified in various shapes according to the sizes and the number of light emitting diodes which are being mounted.

FIGS. 4 through 7 are views illustrating mounting states of light emitting diodes of a light emitting device according to an embodiment, and show various shapes of the heat radiation mounting part 15.

Figure 4:
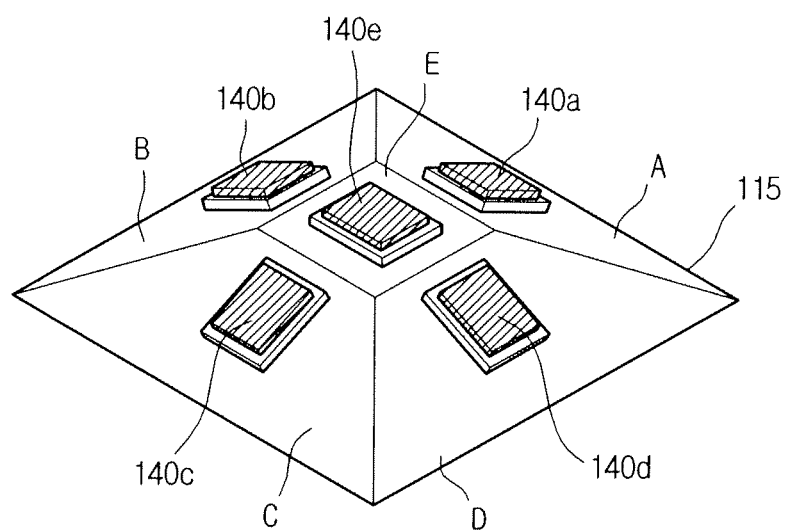
FIGS. 4 through 7 are views illustrating mounting states of light emitting diodes of a light emitting device according to an embodiment.
Figure 5:
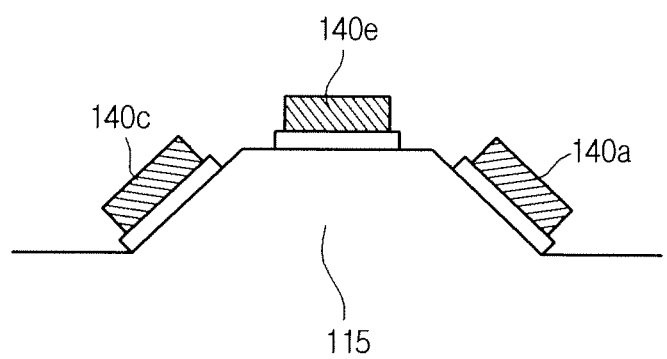

FIG. 4 is a perspective view of a heat radiation mounting part 115 on which five light emitting diodes 140a, 140b, 140c, 140d, 140e are mounted, and FIG. 5 is a cross-sectional view of FIG. 4.

The heat radiation mounting part 115 shown in FIGS. 4 and 5 is formed in a truncated pyramid shape having four inclination surfaces A, B, C, D at sides thereof and one top surface E parallel to a bottom surface. Therefore, the four light emitting diodes 140a, 140b, 140c, 140d are mounted with a slope on the four inclination surfaces A, B, C, D, and the one light emitting diode 140e is mounted on the top surface E parallel to the bottom surface.

According to the above constitution, the orientation angle of the light emitting device may be expanded by the light emitting diodes 140a, 140b, 140c, 140d mounted on the four inclination surfaces A, B, C, D, and a front light intensity may be enhanced by the light emitting diode 140e mounted on the top surface E.

Herein, the top surface E may be also formed with a slope with respect to the bottom surface. When the top surface E is formed with a slope, the orientation angle of the light emitting device may be inclined in a specific direction according to the inclined direction of the top surface E.

The heat radiation mounting part 115 is a polyhedral structure having five mounting surfaces A, B, C, D, E, and inner spaces formed by the five mounting surfaces A, B, C, D, E may function as a heat radiation space capable of radiating heat generated from the five light emitting diodes 140a, 140b, 140c, 140d, 140e. Accordingly, a plurality of light emitting diodes can be mounted and at the same time the heat radiation efficiency can be guaranteed.

Figure 6:
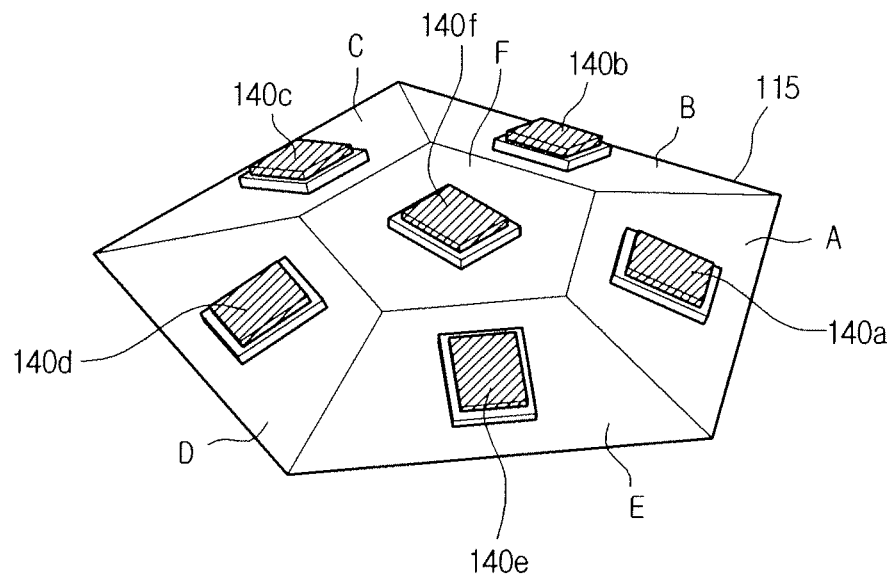

FIG. 6 is a perspective view exemplarily showing a heat radiation mounting part 115 on which six light emitting diodes 140a, 140b, 140c, 140d, 140e, 140f are mounted.

The heat radiation mounting part 115 shown in FIG. 6 is formed in a truncated pentagonal pyramid shape having five inclination surfaces A, B, C, D, E at sides thereof and one top surface F parallel to a bottom surface. Therefore, the five light emitting diodes 140a, 140b, 140c, 140d, 140e are mounted with a slope on the five inclination surfaces A, B, C, D, E and the one light emitting diode 140f is mounted on the top surface F parallel to the bottom surface.

Thus, by integrating the plurality of light emitting diodes 140a, 140b, 140c, 140d, 140e in one light emitting device, the light efficiency of the light emitting device can be enhanced, and by adjusting the slopes of the mounting surfaces of the respective light emitting diodes 140a, 140b, 140c, 140d, 140e, the orientation angle of the light emitting device can be adjusted.

Figure 7:
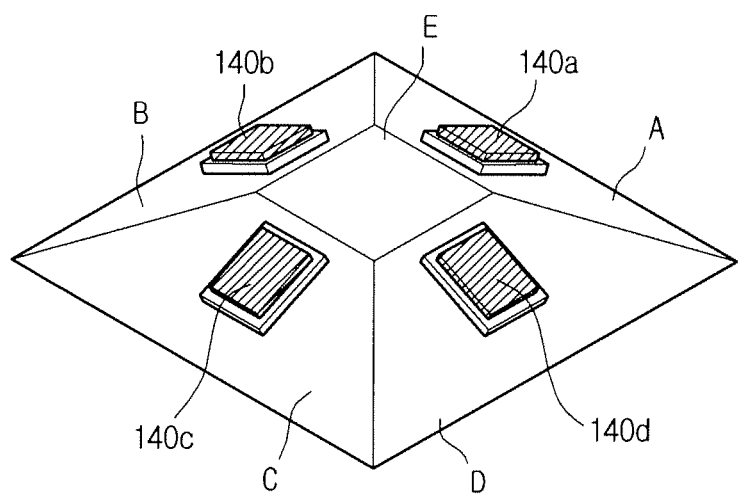

FIG. 7 exemplarily shows a heat radiation mounting part 115 on which four light emitting diodes 140a, 140b, 140c, 140d are mounted.

The heat radiation mounting part 115 shown in FIG. 7 is formed in a truncated pyramid shape having four inclination surfaces A, B, C, D at sides thereof and one top surface E parallel to a bottom surface. Herein, the four light emitting diodes 140a, 140b, 140c, 140d are mounted on the four inclination surfaces A, B, C, D, and the top surface E may be left without mounting a light emitting diode.

According to the above constitution, the orientation angle of the light emitting device may be expanded by the light emitting diodes 140a, 140b, 140c, 140d mounted on the four inclination surfaces A, B, C, D, and heat generated from the four light emitting diodes 140a, 140b, 140c, 140c can be more effectively radiated through the top surface E.

Thus, in the case where some of the mounting surfaces of the heat radiation mounting part is left open without mounting a light emitting diode, the heat radiation efficiency of the heat radiation mounting part 115 can be further enhanced.

Figure 8:
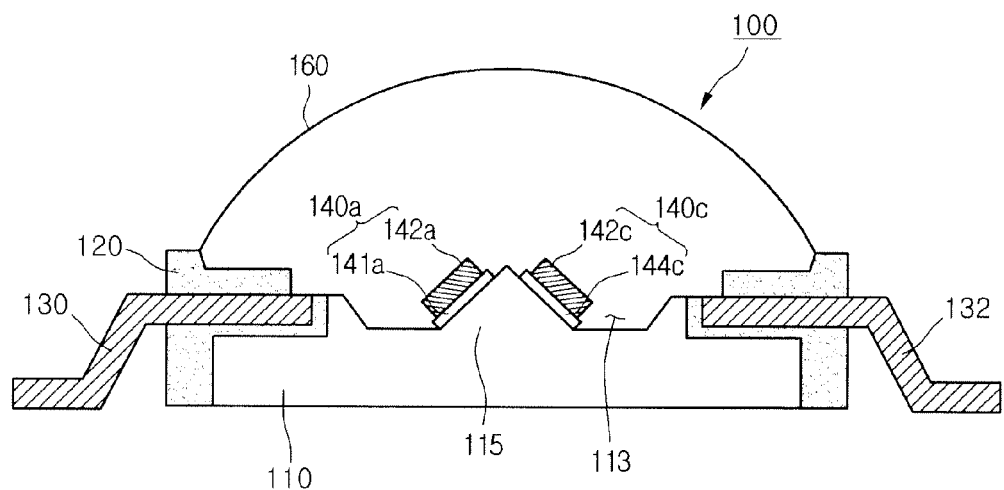
FIG. 8 is a cross-sectional view of a light emitting device according to a second embodiment.

FIG. 8 is a cross-sectional view of a light emitting device according to a second embodiment, and exemplarily shows that the current embodiment is applied to a lead frame package type light emitting devices. In describing the second embodiment, the same constitutions as those in the first embodiment will be referred from the previous description and thus the repeated description will be omitted.

A light emitting device 100 according to the second embodiment includes a body 120 having a cavity 113, a first electrode 130 and a second electrode 132 disposed inside the body 120, a heat radiation member 110 having two or more inclination surfaces for mounting light emitting diodes 140a, 140b, 140c, 140d in the cavity 113 and thermally connected to the light emitting diodes 140a, 140b, 140c, 140d, and a lens part 160 formed at a light emitting region of the body 120 on which the light emitting diodes 140a, 140b, 140c, 140d are mounted, scattering or focusing light.

The cavity 113 may be sealed by using a transparent sealant (not shown). A fluorescent material for converting light emitted from the light emitting diodes 140a, 140b, 140c, 140d to a light having a predetermined color may be added to the transparent sealant.

The lens part 160 may be disposed on the light emitting diodes 140a, 140b, 140c, 140d to change the orientation angle of the light emitted from the light emitting diodes 140a, 140b, 140c, 140d. The lens part 160 may be disposed directly in contact with the light emitting diodes 140a, 140b, 140c, 140d or apart from the light emitting diodes 140a, 140b, 140c, 140d, and has a shape for scattering or focusing light. For example, the lens part 160 may be formed in various shapes, such as a semispherical shape an upper surface of which is convex, or in a shape having a convex upper surface and a concave portion formed in the convex upper surface. Also, according to the directions and slopes of the inclination surfaces on which the light emitting diodes 140a, 140b, 140c, 140d are mounted, the lens part 160 may be formed in a asymmetric semispherical shape in which only a region corresponding to the light emitting region is protruded or recessed. The lens part 160 may be formed of a material including a transparent resin material such as silicon or epoxy, and may include a fluorescent material at least a portion thereof.

Therefore, lights emitted from the light emitting diodes 140a, 140b, 140c, 140d mounted on the mounting part 115, 117 may be scattered or focused by the lens part 160 and then emitted.

Figure 9:
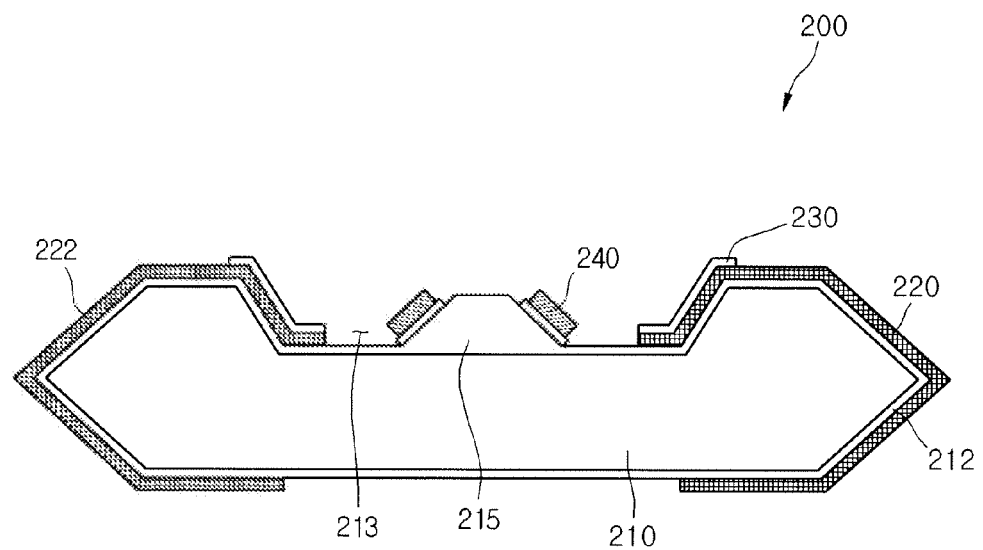
FIG. 9 is a cross-sectional view of a light emitting device according to a third embodiment.
Figure 10:
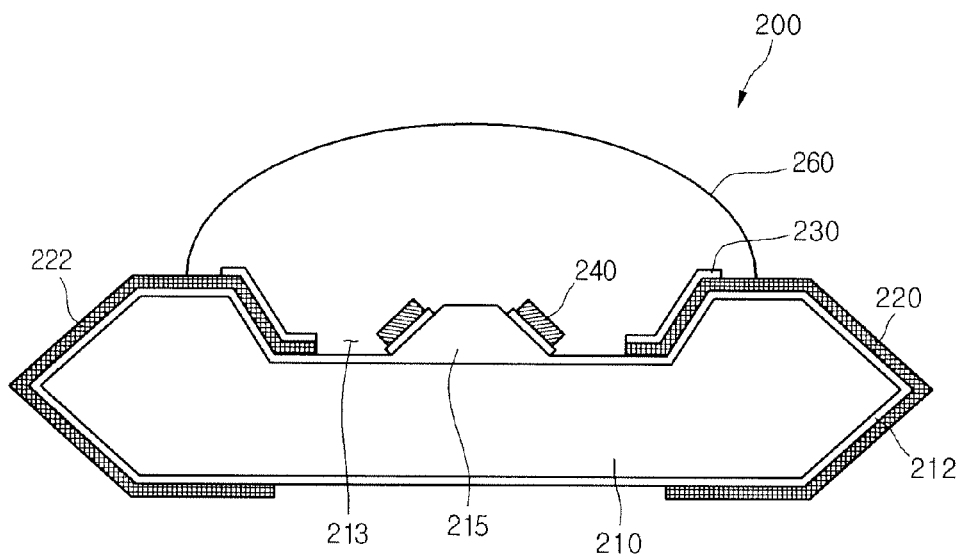
FIG. 10 is a cross-sectional view of a light emitting device according to a fourth embodiment.

FIG. 9 is a cross-sectional view of a light emitting device according to a third embodiment, and FIG. 10 is a cross-sectional view of a light emitting device according to a fourth embodiment. FIGS. 9 and 10 exemplarily show that the embodiments are applied to wafer level package type light emitting devices. The light emitting devices shown in FIGS. 9 and 10 will be described with reference to the heat radiation mounting part shown in FIG. 7.

As shown in FIG. 9, the light emitting device 100 according to the third embodiment includes a body 210 having a cavity 213, an insulating layer 212 on a surface of the body 210, first electrode 130 and second electrode 132 on the body 210, a reflective layer 230 formed on at least some region of the insulating layer, reflecting light, and a heat radiation mounting part 215 providing inclination surfaces for mounting light emitting diodes 240. The cavity 213 in which the light emitting diodes 240 are mounted may be sealed by using a sealant (not shown).

The cavity 213 in which the light emitting devices 240 are mounted may be formed at an upper portion of the body 210. The body 210 may be formed of various materials such as silicon (Si), aluminum (Al), aluminum nitride (AlN), aluminum oxide ($AlO_x$), photo sensitive glass (PSG), sapphire ($Al_2O_3$), beryllium oxide (BeO), or the like.

The cavity 213 may be formed in a concave container shape, such as a cup shape, a polygonal shape, an elliptical shape, a circular shape, etc. Herein, a circumferential surface of the cavity 213 may be formed vertically or with a predetermined slope in consideration of distribution angles of lights emitted from the mounted light emitting diodes 240. The cavity 213 may be formed with various methods according to the material of the body 210. For example, when the body 210 is formed of silicon (Si), the cavity 213 may be formed by performing a wet etching.

The insulating layer 212 prevents the body 210 from being electrically shorted to the first and second electrodes 220, 222, the reflective layer 230, an external power, or the like. The insulating layer 212 may be formed of at least one of silicon oxide ($SiO_2$, $Si_xO_y$), silicon nitride ($Si_3N_4$, $Si_xN_y$), silicon oxynitride ($SiO_xN_y$), and aluminum oxide ($Al_2O_3$), preferably, silicon oxide ($SiO_2$, $Si_xO_y$), but the invention is not limited thereto. Also, in the case where the body 210 is formed of insulator such as aluminum nitride (AlN), aluminum oxide ($AlO_x$), or the like, the insulating layer 212 may not be formed.

The first electrode 220 and the second electrode 222 may be formed on the insulating layer 212 to supply power to the light emitting device 240. The first electrode 220 and the second electrode 222 may be formed separately as a positive electrode and a negative electrode, and may be formed in two or more electrodes.

The reflective layer 230 may be formed at a position capable of efficiently reflecting lights emitted from the light emitting diodes 240, for example, inside the cavity 213 of the body 210, but the invention is not limited thereto. The reflective layer 230 may have a multi-layer structure, for example, a Ti/Ag structure including a titanium (Ti) layer and a silver (Ag) layer stacked sequentially.

The light emitting diode 240 may be at least one of a red light emitting diode emitting red light, a green light emitting diode emitting green light, and a blue light emitting diode emitting blue light, but the invention is not limited thereto. In this embodiment, since the light emitting diodes 240 are two or more, it is also possible to apply the light emitting diodes 240 each emitting a different color light.

A heat radiation mounting part 215 having a plurality of mounting surfaces for mounting the plurality of light emitting diodes 240 is formed in a polyhedral shape on the insulating layer 212.

The heat radiation mounting parts 215 shown in FIGS. 9 and 10 employ the truncated pyramid shape shown in FIG. 7. That is, fourth inclination surfaces for mounting four light emitting diodes 240 are formed in the heat radiation mounting parts 215, respectively, and a top surface parallel to a bottom surface thereof is left open without a light emitting diode.

The plurality of light emitting diodes 240 are respectively fixed with a slope on the inclination surfaces of the heat radiation mounting part 215 having the truncated pyramid shape. Accordingly, an orientation angle of each of the light emitting diodes 240 is inclined according to the slope of the inclination surface, and thus the orientation angle in a specific direction may be increased. Accordingly, the orientation angle of the light emitting device 200 including the plurality of light emitting diodes 240 may be expanded or be concentrated in specific direction.

FIG. 10 is a cross-sectional view of a light emitting device according to a fourth embodiment, and exemplarily shows that the embodiment is applied to a wafer level package type light emitting device. In describing the fourth embodiment, the same constitution as that in the third embodiment will be referred from the previous description and thus the repeated description will be omitted.

The light emitting device 200 according to the fourth embodiment includes a heat radiation mounting part 215 having a polyhedral structure shape providing a plurality of mounting surfaces on which a plurality of light emitting diodes 240 are mounted in a cavity 213 of a body 210.

A lens part 260 capable of scattering or focusing light may be formed at the light emitting region of the cavity 213 on which the light emitting diodes 240 are mounted.

The cavity 213 may be sealed by using a sealant (not shown). A fluorescent material for converting light emitted from the light emitting diodes 240 to a light having a predetermined color may be added to the transparent sealant.

The lens part 260 may be disposed on the light emitting diodes 240 to change the orientation angles of lights emitted from the light emitting diodes 240. The lens part 260 may be disposed directly in contact with the light emitting diodes 240 or apart from the light emitting diodes 240, and has a shape for scattering or focusing light. For example, the lens part 260 may be formed in various shapes, such as a semispherical shape an upper surface of which is convex, or in a shape having a convex upper surface and a concave portion formed in the convex upper surface. Also, according to the directions and slopes of the inclination surfaces on which the light emitting diodes 240 are mounted, the lens part 260 may be also formed in a asymmetric semispherical shape in which only a region corresponding to the light emitting region is protruded or recessed. The lens part 260 may be formed of a material including a transparent resin material such as silicon or epoxy, and may include a fluorescent material at least a portion thereof.

By mounting the light emitting diodes 240 on the heat radiation mounting part 215, the irradiation angle of light emitted from each of the light emitting diodes 240 is inclined according to the inclination surface, and thus the orientation angle of the light emitting device 200 can be adjusted.

The lights emitted from the light emitting diodes 240 mounted on the mounting part 215 may be scattered or focused by the lens part 260 and then emitted. Therefore, by modifying the shape of the lens part 260, it is possible to enhance the orientation angle and light emitting characteristics of the light emitting device 200.

Figure 11:
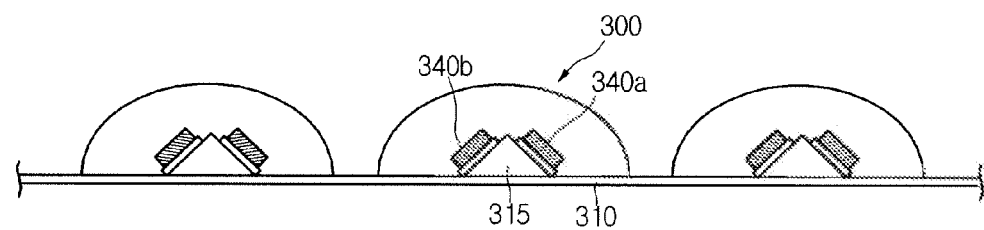
FIG. 11 is a cross-sectional view of a light emitting device according to a fifth embodiment.
Figure 12:
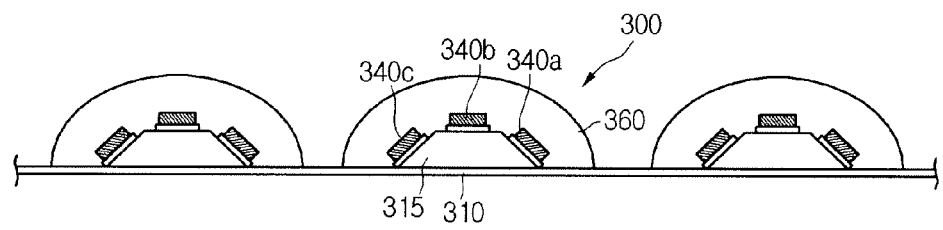
FIG. 12 is a cross-sectional view of a light emitting device according to a sixth embodiment.

FIG. 11 is a cross-sectional view of a light emitting device 300 according to a fifth embodiment, and FIG. 12 is a cross-sectional view of a light emitting device 300 according to a sixth embodiment. FIGS. 11 and 12 exemplarily show that the current embodiments are applied chip on board (COB) type light emitting devices in which light emitting diodes 340 are mounted in a chip shape on a substrate 310.

As shown in FIG. 11, the light emitting device 300 includes the substrate 310, a heat radiation mounting part 315 providing inclination surfaces for mounting the plurality of light emitting diodes 340, and a resin part 360 sealing the light emitting diodes 340, and the light emitting diodes 340 may be electrically connected to the substrate 310 through a wire (not shown).

The substrate 310 may use various substrates, such as a single-layer printed circuit board (PCB), a multi-layer PCB, an FPCB, a ceramic substrate, a metal substrate, etc. A lead frame or an electrode layer for supplying power may be patterned on the substrate 310, and a reflective layer may be formed. Also, a cavity for mounting the light emitting diodes 340 may be formed.

The heat radiation mounting part 315 may be formed in a polyhedral structure having mounting surfaces on which the light emitting diodes 340a, 340b are mounted. The light emitting device 300 of FIG. 10 according to the fifth embodiment exemplarily shows that the heat radiation mounting part 315 is formed in a quadrangular pyramid shape (see FIG. 3). Accordingly, four light emitting diodes may be mounted on inclination surfaces of the heat radiation mounting part 315. The heat radiation mounting part 315 may be formed by processing the substrate 310 to allow mounting regions of the substrate 310 to be protruded with inclination surfaces, or by attaching a protruded and inclined structure capable of mounting the light emitting diodes 340a, 340b on the substrate 310. The light emitting diodes 340a, 340b may be arranged in plurality on the substrate 310 in a row direction and/or a column direction.

The light emitting diodes 340a, 340b are mounted on the heat radiation mounting part 315, and then are electrically connected to the substrate 310. The light emitting diodes 340a and 340b may be fixed with a slope according to slopes of the inclination surfaces provided by heat radiation mounting part 315. Therefore, according to the mounting angles of the light emitting diodes 340a, 340b, the orientation angle of the light emitting device 300 varies. The light emitting diodes 340a, 340b may be electrically connected to the substrate 310 by using a wire bonding, a flip chip bonding, a die bonding, or the like. The light emitting diodes 340a, 340b may be at least one of a red light emitting diode emitting red light, a green light emitting diode emitting green light, and a blue light emitting diode emitting blue light, or it is also possible to apply the light emitting diodes 340a, 340b each emitting a different color light.

A resin part 360 may seal the light emitting diodes 340a, 340b mounted on the heat radiation mounting part 315. The resin part 360 may be formed in a semispherical shape or a convex lens shape using a transparent resin such as epoxy, and the material and shape of the resin part 360 may be modified according to the layout of the light emitting device 300. Also, a fluorescent material changing the light emitting characteristic of the light emitting device 300 may be added to at least a region of the resin part 360.

A light emitting device according to a sixth embodiment shown in FIG. 12 is different in the shape of the heat radiation mounting part from the light emitting device according to the fourth embodiment. Therefore, the repeated description on the same constitutions as those in the fourth embodiment will be omitted.

The heat radiation mounting part 315 of the light emitting device 300 according the sixth embodiment shown in FIG. 6 may be formed in a truncated trapezoidal pyramid shape (see FIG. 4). Accordingly, the heat radiation mounting part 315 has four inclination surfaces at sides thereof, and a top surface parallel to a bottom surface thereof. That is, a total of five mounting surfaces may be formed to thus mount five light emitting diodes on the five mounting surfaces.

According to the above constitution, four light emitting diodes 340a, 340c may be mounted on the four inclination surfaces, and a light emitting diode 340b may be mounted on the top surface. Thus, when the light emitting diodes 340a, 340b, 340c are mounted on the heat radiation part 315, the orientation angle of the light emitting device 300 may be expanded by the light emitting diodes 340a, 340c mounted on the four inclination surfaces, and a front light intensity may be enhanced by the light emitting diode 340b mounted on the top surface.

As described in the fifth and sixth embodiments, the COB type light emitting devices includes the heat radiation mounting part 315 having a polyhedral structure providing a plurality of mounting surfaces such that a plurality of light emitting diodes are mounted. Accordingly, the COB type light emitting devices can adjust the orientation angle, can enhance the light efficiency and guarantee the heat radiation efficiency without a large change in the structure of the light emitting device.

Figure 13:
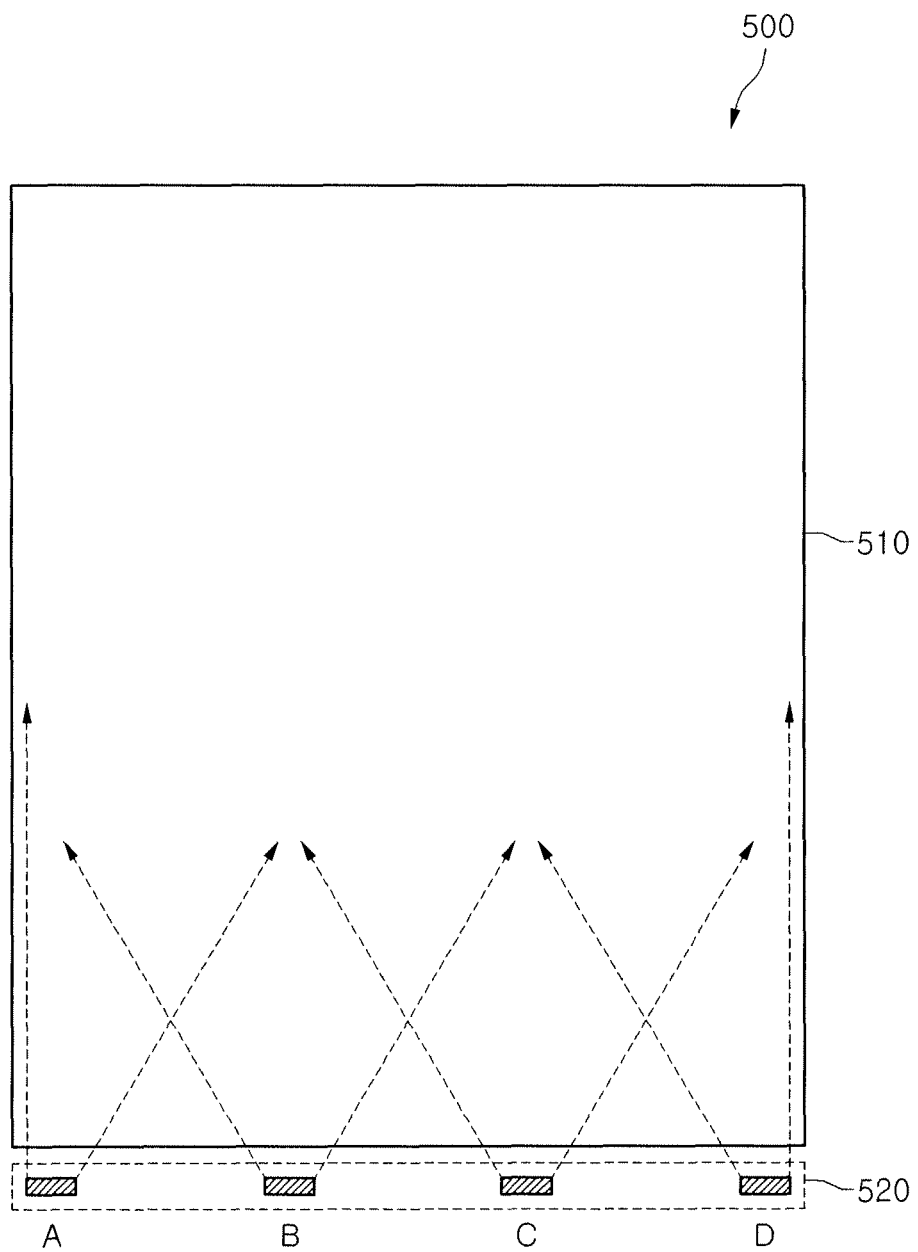
FIG. 13 is a schematic view of a light unit according to a first embodiment.

FIG. 13 is a schematic view of a light unit 500 according to a first embodiment, and exemplarily shows an edge type backlight unit.

As shown in FIG. 13, the light unit 500 includes a light guide panel 510 guiding light, and a light source 520 supplying the light guide panel 510 with light and including at least one or more light emitting devices having different orientation angles.

The light guide panel 510 may reflect, refract and scatter lights emitted from the light emitting devices arranged at one side and convert the light to a plane light through a front surface thereof. The light guide panel 510 may be formed of a material, such as polycarbonate-series resin (PC), polymethylmethacrylate-series resin (PMMA), methacrylate-styrene copolymer (MS), or the like.

The light source 520 includes a plurality of light emitting devices A, B, C, D, and is arranged at a side surface of the light guide panel 510 to provide light to the light guide panel 510. The respective light emitting devices A, B, C, D have orientation angles that are different from one another according to the arrangement position thereof. The light emitting devices may have different orientation angles by mounting two or more light emitting diodes constituting each of the light emitting devices with a slope with respect to a mounted surface thereof.

Among the light emitting devices A, B, C, D, the light emitting devices B and C positioned at a central portion of an edge of the light guide panel 510 may transfer light toward the light guide panel 510 without adjusting the orientation angles.

On the other hand, the light emitting devices A and D positioned at both sides of the edge of the light guide panel 510 have the orientation angles set in a center direction of the light guide panel 510 so as to prevent the light from being leaked to an outside of the light guide panel 510.

Herein, packages of the respective light emitting devices A, B, C, D are mounted on the same plane, but light emitting diodes in each of the light emitting devices emit lights having different orientation angles according to slopes of surfaces on which the light emitting diodes are mounted. Accordingly, the orientation angles of the respective light emitting devices A, B, C, D can be adjusted without changing a design factor of the light emitting devices A, B, C, D.

Also, since the light emitting devices A and D supply more light toward the center portion of the light guide panel 510, the light emitting device B adjacent to the light emitting device A may be arranged with a relatively wide spacing distance. The light emitting device C adjacent to the light emitting device D may be also arranged with a relatively wide spacing distance. Therefore, it is possible to decrease the number of light emitting devices equipped in the light unit 500.

Figure 14:
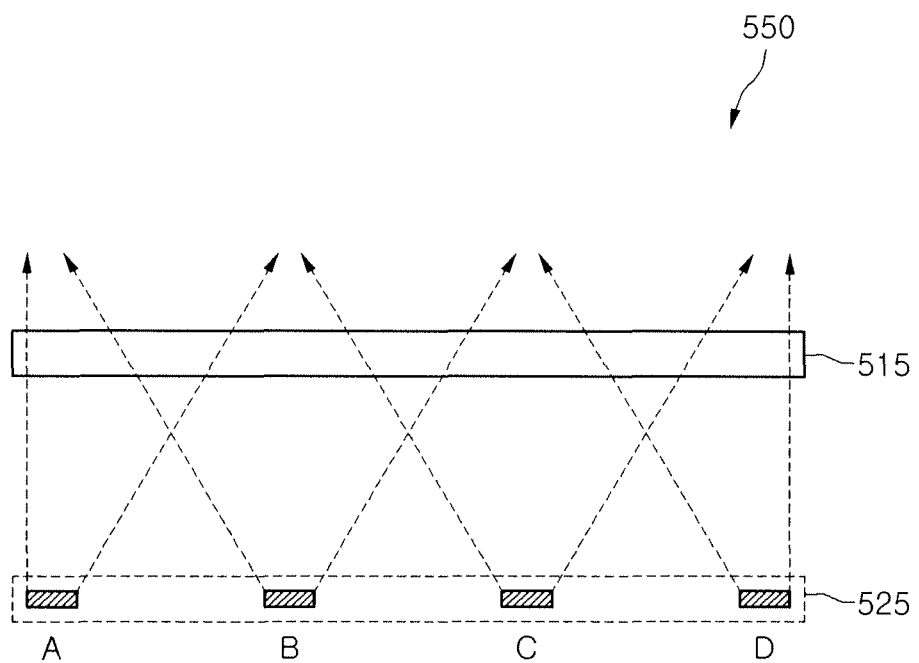
FIG. 14 is a schematic view of a light unit according to a second embodiment.

FIG. 14 is a schematic view of a light unit 550 according to a second embodiment and exemplarily shows a direct type backlight unit.

As shown in FIG. 14, the light unit 550 includes a light diffusion plate 515 diffusing light, and a light source 525 supplying the light diffusion plate 515 with light and including at least one or more light emitting devices having different orientation angles.

The light diffusion plate 515 may supply light generated from the light source 525 to a display panel (not shown) disposed above the light diffusion plate 515. The diffusion plate 515 may be used to guarantee uniform luminance and chromaticity. The light diffusion plate 515 is disposed apart by a predetermined spacing from the light source 525, and may selectively include optical sheets, such as a diffusion sheet, a prism sheet, a brightness enhancement film, a protection sheet, etc.

The light source 525 includes a plurality of light emitting devices A, B, C, D, and is arranged at a side surface of the light diffusion plate 515 to provide light to the light diffusion plate 515. The respective light emitting devices A, B, C, D have orientation angles that are different from one another according to the arrangement position thereof.

Among the light emitting devices A, B, C, D, the light emitting devices B and C arranged at a central region of the light diffusion plate 515 can enhance light efficiency of the light unit 550 by adjusting the orientation angles at wider angles.

The light emitting devices A and D arranged at an edge of the light diffusion plate 515 have the orientation angles set in a center direction of the light diffusion plate 515 so as to prevent the light from being leaked to an outside of the light diffusion plate 515.

Herein, packages of the respective light emitting devices A, B, C, D are mounted on the same plane, but light emitting diodes in each of the light emitting devices emit lights having different orientation angles according to slopes of surfaces on which the light emitting diodes are mounted. Accordingly, the orientation angles of the respective light emitting devices A, B, C, D can be adjusted without changing a design factor of the light emitting devices A, B, C, D.

Also, in the case where the orientation angles of the light emitting devices A and D are set to wide angles, the light emitting device B adjacent to the light emitting device A may be arranged with a relatively wide spacing distance, and the light emitting device C adjacent to the light emitting device D may be also arranged with a relatively wide spacing distance. Therefore, it is possible to decrease the number of light emitting devices equipped in the light unit 500.

As described above, in the light units 500 and 550 according to the embodiments, the light emitting devices having orientation angles different according to the position of the light emitting devices are arranged, thereby capable of preventing light from being leaked to an outside of the light guide panel 510 or an outside of the light diffusion plate 515, and thus enhancing the light efficiency.

Figure 15:
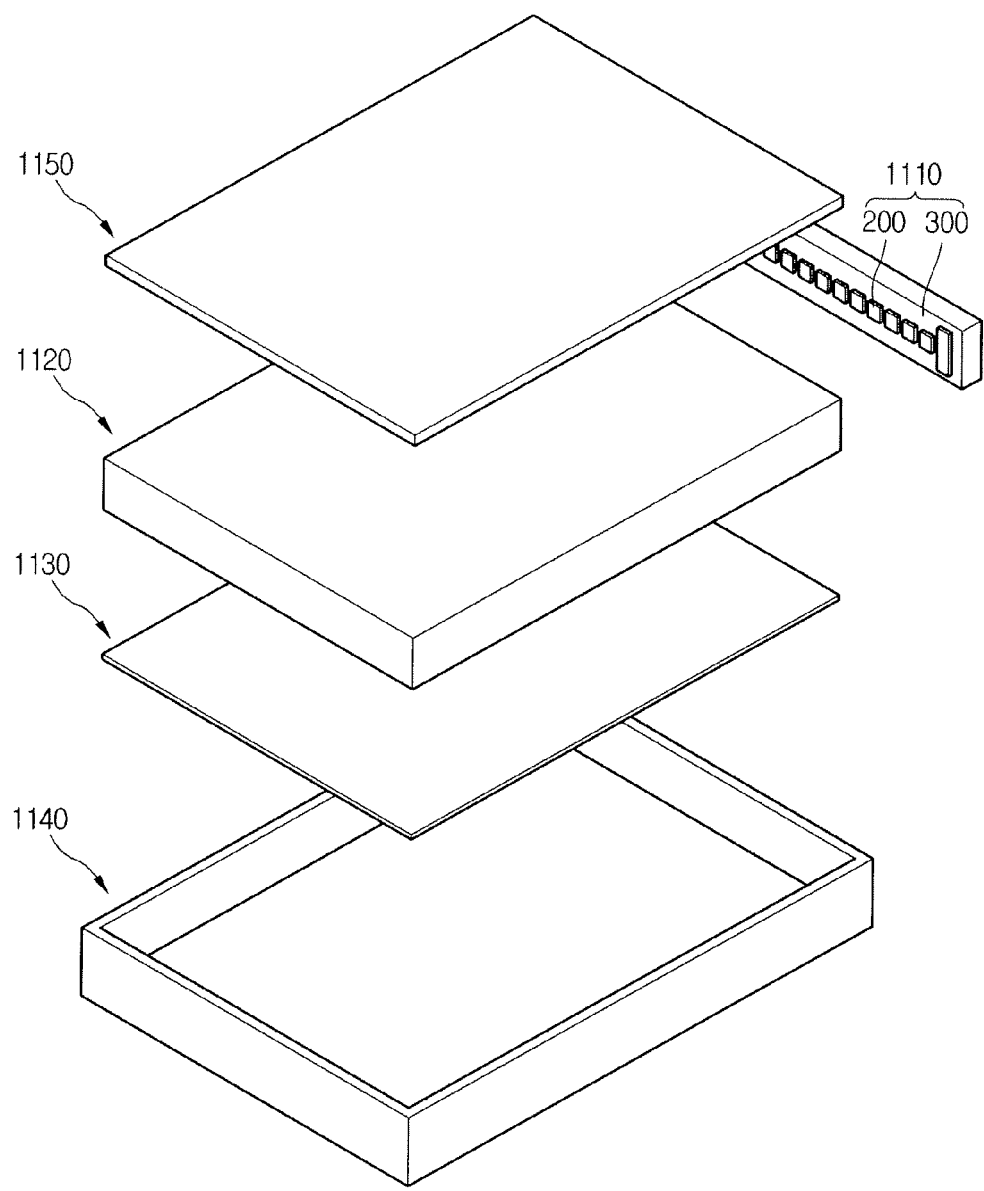
FIG. 15 is a disassembled perspective view of a backlight unit including a light emitting device or a light emitting device package according to an embodiment.
Figure 16:
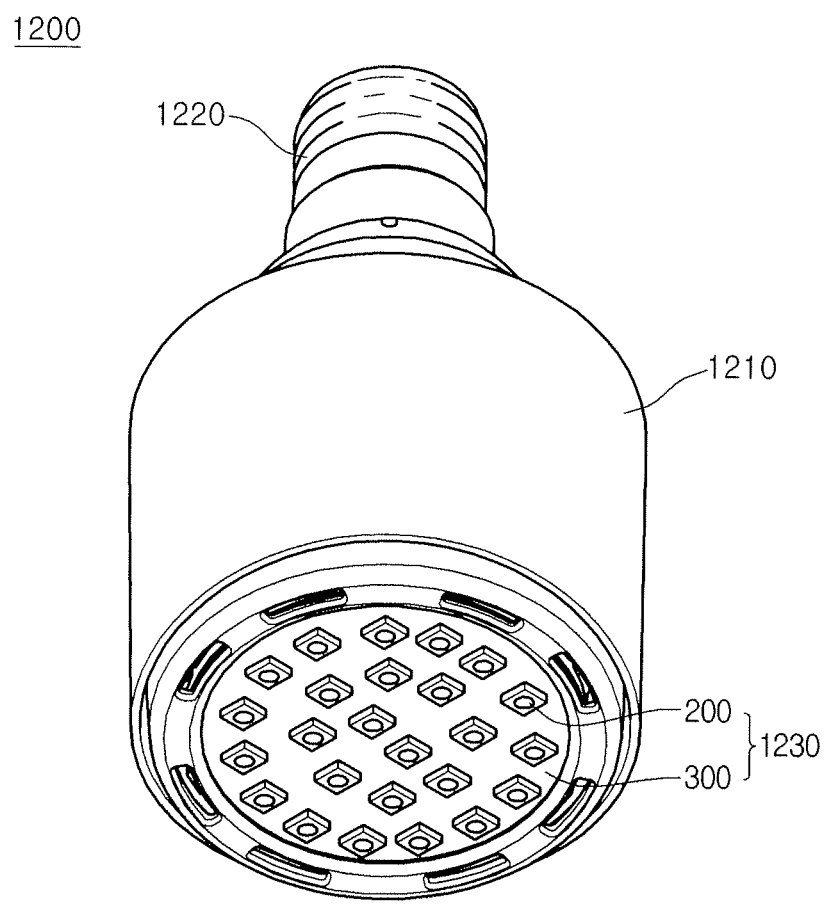
FIG. 16 is a perspective view of a light uniting using a light emitting device package according to an embodiment.

FIG. 15 is a disassembled perspective view of a backlight unit using a light emitting device package according to an embodiment. The backlight unit 1100 shown in FIG. 16 is an example of lighting systems, and the invention is not limited thereto.

Referring to FIG. 15, the backlight unit 1100 may include a bottom frame 1140, a light guide member 1120 disposed in the bottom frame 1140, and a light emitting module 1110 disposed at least one side surface of the light guide member 1120 or below the light guide member 1120. Also, a reflective sheet 1130 may be disposed below the light guide member 1120.

The bottom frame 1140 may be formed in a box shape a top surface of which is opened such that the light guide member 1120, the light emitting module 1110 and the reflective sheet 1130 can be received. The bottom frame 1140 may be formed of a metal or resin material, but the invention is not limited thereto.

The light emitting module 1110 may include a substrate and a plurality of light emitting device packages mounted on the substrate according to the embodiments. The plurality of light emitting device packages may provide light to the light guide member 1120.

As shown in FIG. 16, the light emitting module 1110 may be disposed at least one of inner side surfaces of the bottom frame 1140, and thus may provide light to at least one of the side surfaces of the light guide member 1120.

It is also to be understood that the light emitting module 1110 may be disposed below the bottom frame 1140 to provide light toward a bottom surface of the light guide member 1120. However, since such a constitution may be modified according to the design of the backlight unit 1100, the invention is not limited thereto.

The light guide member 1120 may be disposed inside the bottom frame 1140. The light guide member 1120 may convert the light provided from the light emitting module to a plane light source and guide the converted plane light source to a display panel (not shown).

The light guide member 1120 may be, for example, a light guide panel (LGP). The LGP may be formed of, for example, one of acryl-series resin such as polymethyl metaacrylate (PMMA), polyethylene terephthlate (PET), poly carbonate (PC), COC, or polyethylene naphthalate resin.

An optical sheet 1150 may be disposed above the light guide member 1120.

The optical sheet 1150 may include, for example, at least one of a diffusion sheet, a prism sheet, a brightness enhancement sheet and a fluorescent sheet. For example, the optical sheet 1150 may be configured by the diffusion sheet, the prism sheet, the brightness enhancement sheet and the fluorescent sheet stacked. In this case, the diffusion sheet 1150 diffuses the light emitted from the light emitting module 1110 uniformly, and the diffused light may be focused on the display panel (not shown) by the prism sheet. At this time, the light emitted from the prism sheet is a randomly polarized light, and the brightness enhancement sheet may increase the polarization of the light emitted from the prism sheet. The prism sheet may be, for example, a vertical and/or horizontal sheet. Also, the brightness enhancement sheet may be, for example, a brightness enhancement film. Also, the fluorescent sheet may be a transparent plate or film including a fluorescent material.

The reflective sheet 1130 may be disposed below the light guide member 1120. The reflective sheet 1130 may reflect light emitted from the bottom surface of the light guide member 1120 toward a light emitting surface of the light guide member 1120.

The reflective sheet 1130 may be formed of, for example, resin material having good reflectivity, for example, PET, PC, PVC resins, or the like, but the invention is not limited thereto.

FIG. 16 is a perspective view of a light unit using a light emitting device package according to an embodiment. The lighting unit 1200 of FIG. 16 is an example of lighting systems and the invention is not limited thereto.

Referring to FIG. 16, the lighting unit 1200 may include a case body 1210, a light emitting module 1230 installed in the case body 1210, and a connection terminal installed in the case body 1210, receiving power from an external power source.

The case body 1210 may be preferably formed of a material having good heat shielding characteristic, for example, a metal material or a resin material.

The light emitting module 1230 may include a substrate 300, and a light emitting device package mounted on the substrate 300 according to at least one of the embodiments.

The substrate 300 may be an insulator substrate on which a circuit pattern is printed, and may include, for example, a general printed circuit board (PCB), a metal core PCB, a flexible PCB, a ceramic PCB, etc.

Also, the substrate 300 may be formed of a material to efficiently reflect light, and a surface thereof may be formed in a color capable of efficiently reflecting light, for example, white color, silver color.

The light emitting device packages according to at least one of the embodiments may be mounted on the substrate 300. Each of the light emitting device packages 200 may include at least one light emitting diode (LED). The light emitting diode may include a color LED emitting red, green, blue or white light, and a UV LED emitting ultraviolet (UV).

The light emitting module 1230 may have a combination of several LEDs so as to obtain desired color and luminance. For example, the light emitting module 130 may have a combination of a white LED, a red LED, and a green LED so as to obtain a high color rendering index (CRI). A fluorescent sheet may be further disposed on a path of light emitted from the light emitting module 1230. The fluorescent sheet converts the wavelength of the light emitted from the light emitting module. For example, when the light emitted from the light emitting module 1230 has a blue wavelength band, the fluorescent sheet may include a yellow fluorescent material, so that the light, which is emitted from the light emitting module 1230 and passes through the fluorescent sheet, finally appears as white light.

The connection terminal 1220 may be electrically connected to the light emitting module 1230 to supply power to the light emitting module 1230. As shown in FIG. 16, the connection terminal 1220 may be screwed and coupled to an external power, but the invention is not limited thereto. For example, the connection terminal 1220 may be made in a pin type and inserted into an external power, or may be connected to the external power through a power line.

As described above, the lighting system may include at least one of a light guide member, a diffusion sheet, a prism sheet, a brightness enhancement sheet and a fluorescent sheet on a traveling path of light to obtain a desired optical effect.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body including a cavity having a horizontal bottom surface;
an insulating layer on a surface of the body;
an electrode over at least a portion of the insulating layer;
a heat radiation mounting part formed in the cavity and protruding from the horizontal bottom surface, the heat radiation mounting part comprising two or more surfaces that are inclined with respect to the horizontal bottom surface; and
two or more light emitting diodes, wherein each of the two or more light emitting diodes is mounted on a respective one of the two or more inclined surfaces, and wherein each of the two or more light emitting diodes is electrically connected to the electrode.

2. The light emitting device of claim 1, wherein the heat radiation mounting part is thermally connected to each of the two or more light emitting diodes.

3. The light emitting device of claim 2, wherein the body further comprises an opening through a rear portion thereof, opposite the horizontal surface, and wherein the heat radiation member is exposed through the opening.

4. The light emitting device of claim 1, wherein the insulating layer is formed of silicon oxide.

5. The light emitting device of claim 1, wherein the heat radiation mounting part comprises at least three inclined surfaces, and wherein the portion of the heat radiation mounting part that includes the at least three inclined surfaces has a pyramidal shape.

6. The light emitting device of claim 5, wherein the portion of the heat radiation mounting part that includes the at least three inclined surfaces has a truncated pyramidal shape that includes a horizontal surface which shares a common edge with each of the at least three inclined surfaces.

7. The light emitting device of claim 1, wherein each of the inclined surfaces has a slope greater than 0° and less than or equal to 30° with respect to the horizontal surface.

8. The light emitting device of claim 1, wherein each of the two or more light emitting diodes has an orientation angle that depends upon the slope of the respective inclined surface on which it is mounted.

9. The light emitting device of claim 1 further comprising:
a lens over the two or more light emitting diodes.

10. The light emitting device of claim 1, further comprising:
a reflective layer disposing on the insulating layer in the cavity.

11. The light emitting device of claim 10, wherein the reflective layer is disposed on the insulating layer corresponding to an inclined region of the cavity.

12. A light emitting device comprising:
a body including a cavity having a horizontal bottom surface;
an insulating layer on a surface of the body;
a reflective layer disposed on the insulating layer in the cavity;
an electrode disposed in the body;
a heat radiation member formed in the cavity and protruding from the horizontal bottom surface, the heat radiation member comprising a mounting part that includes two surfaces that are inclined with respect to the horizontal bottom surface; and
two or more light emitting diodes, wherein each of the two or more light emitting diodes is mounted on a respective one of the two or more inclined surfaces, and wherein each of the two or more light emitting diodes is electrically connected to the electrode.

13. The light emitting device of claim 12, wherein the mounting part has a pyramidal shape comprising at least three inclined surfaces.

14. The light emitting device of claim 13, wherein the mounting part has a truncated pyramidal shape that includes a horizontal surface which shares a common edge with each of the at least three inclined surfaces.

15. The light emitting device of claim 12, wherein each of the two or more light emitting diodes has an orientation angle that depends upon the slope of the respective inclined surface on which it is mounted.

16. The light emitting device of claim 12 further comprising:
a lens over the two or more light emitting diodes.

17. The light emitting device of claim 12, wherein the reflective layer is disposed on the insulating layer corresponding to an inclined region of the cavity.

* * * * *